(12) United States Patent
Mikagi

(10) Patent No.: US 6,413,807 B1
(45) Date of Patent: Jul. 2, 2002

(54) SEMICONDUCTOR DEVICE HAVING SILICIDE FILMS ON A GATE ELECTRODE AND A DIFFUSION LAYER AND MANUFACTURING METHOD THEREOF

(75) Inventor: Kaoru Mikagi, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/585,272

(22) Filed: Jun. 2, 2000

(30) Foreign Application Priority Data

Jun. 29, 1999 (JP) .......................................... 11-182648

(51) Int. Cl.$^7$ ............................................ H01L 21/336
(52) U.S. Cl. ...................... 438/198; 438/197; 438/299; 438/301; 257/288; 257/382; 257/412; 257/413
(58) Field of Search .................................. 257/288, 412, 257/382, 384, 413; 438/198, 299, 301

(56) References Cited

U.S. PATENT DOCUMENTS 5,883,418 A * 3/1999 Kimura ...................... 257/412

OTHER PUBLICATIONS

K. Goto et al., "Leakage Mechanism and Optimized Conditions of Co Salicide Process for Deep-Submicron CMOS Devices", Technical Digest Of IEEE International Electron Device Meeting 1995 (IEDM95), pp. 449–452, 1995.

* cited by examiner

*Primary Examiner*—Edward Wojciechowicz
(74) *Attorney, Agent, or Firm*—Young & Thompson

(57) ABSTRACT

Silicide films having a high heat-resistance are formed on a gate electrode, simultaneously with silicide films having good junction leakage characteristics on diffusion layers. A transistor includes a polycrystalline silicon gate electrode, a gate insulating film, a diffusion layer, and sidewalls on a silicon substrate isolated by an element isolation oxide film. A first silicide film and a second silicide film are formed on the gate electrode and on the diffusion layer, respectively. The first silicide film is thicker than the second silicide film.

15 Claims, 3 Drawing Sheets

SEMICONDUCTOR DEVICE HAVING SILICIDE FILMS ON A GATE ELECTRODE AND A DIFFUSION LAYER AND MANUFACTURING METHOD THEREOF

BACKGROUND OF THE INVENTION

1. Field of the Invention

The present invention relates to a semiconductor device and a manufacturing method thereof, and, more particularly, to a semiconductor device made by a self-aligned suicide "salicide" technique wherein silicide films are formed on a gate electrode and a diffusion layer of a semiconductor device, and a manufacturing method thereof.

2. Description of the Related Art

In a salicide technique wherein a silicide film is formed in a self-aligned manner on a gate electrode and a diffusion layer of a semiconductor device, it is important that the silicide films have a low electronic resistance and are stable. Previously, a silicide technique using titanium (Ti) has been adopted. Titanium silicide film has a low specific-resistance and a suitable Schottky barrier height for both p-type and n-type silicon.

However, when using conventional methods of forming a Ti silicide film for making a finer semiconductor device, the following problem arises. The impurity concentration of the gate electrode and the surfaces of the diffusion layer increases as a pattern is made finer, which causes an increase in the phase transition temperature from titanium disilicide ($TiSi_2$) of a C49 structure having a high resistance to titanium disilicide of a C54 structure having a low resistance, in the case of silicide overlying an n-type diffusion layer. Therefore, the difference between the phase transition temperature on the p-type silicon and the phase transition temperature on the n-type silicon increases.

Forming a Ti silicide film on an n-type diffusion layer therefore requires such high temperature that a pn-junction leakage characteristic is degraded and the silicide film on a p-type gate and the p-type diffusion layer is formed too thickly. On the contrary, when using the lower temperature necessary for forming a Ti silicide film on a p-type diffusion layer, the silicide film has a higher resistance due to insufficient silicidation and the heat resistance drops due to the resulting thin silicide film on the n-type diffusion layer. Accordingly, this conventional silicide film forming method is not sufficient as a technique for forming the silicide film on the gate electrode and the diffusion layer in a self-alignment manner.

In a paper of "K. Goto et al., Technical Digest of IEEE International Electron Device Meeting 1995 (IEDM95), pp.449–pp.452 (1995)", there is disclosed a method wherein the silicide film is selectively formed on the gate electrode and the diffusion layer in a self-aligned manner by utilizing cobalt (Co) which has a smaller difference in silicide phase transition temperature as between the p-type silicon and n-type silicon, compared with Ti.

A conventional method of forming the silicide film is described with reference to FIGS. 3A to 3D. FIGS. 3A to 3D are schematic sectional views showing the steps of conventional silicide film forming method.

To start with, as shown in FIG. 3A, a MOSFET (metal oxide semiconductor field effect transistor) is formed in an element forming region defined by element isolation regions 102 on a silicon substrate 101. The MOSFET comprises gate oxide films 103, gate silicon films 104, sidewalls 105, and diffusion layers 106 having a n+/p junction depth of 100 nm, which are formed by a LOCOS (local oxidation of silicon) method.

As shown in FIG. 3B, a cobalt (Co) film 108 is formed on the MOSFET to a thickness of about 10 nm by sputtering. A titanium nitride (TiN) film 109 is formed on the Co film 108 to a thickness of about 30 nm by sputtering. The TiN film 109 is formed so as to prevent oxidation during the silicifying thermal treatment of the Co.

As shown in FIG. 3C, the silicon substrate 101 is subjected to a first thermal treatment at 550° C. for 30 sec in a nitrogen atmosphere by a lamp rapid thermal annealing, thereby allowing surface portions of the gate silicon films 104 and the diffusion layers 106 to react with the Co film 108. Thus, a $Co_xSi_y$ film 110 (where $x \geq y$) is formed as a reacted layer of Co and Si on the gate silicon films 104 and the diffusion layers 106 in a self-aligned manner.

As shown in FIG. 3D, the TiN film 109 and that portion of the Co film 108 which remains unreacted on the element isolation region 102 and sidewalls 105, are removed by a wet etching method. After that, the silicon substrate 101 is subjected to a second thermal treatment at 550° C. for 30 sec in a nitrogen atmosphere by a lamp rapid thermal annealing, thereby phase-transitioning the $Co_xSi_y$ film 110 on the gate silicon films 104 and the diffusion layers 106 to a cobalt disilicide ($CoSi_2$) film 111a which is thermally and compositionally stable and has a low resistance.

In this conventional method, cobalt is used as a silicide metal in place of titanium and the titanium nitride (TiN) film is formed on the cobalt film to prevent oxidation of Co upon the thermal treatment, thereby solving the problems of the silicide film having a high resistance and forming too thickly due to the higher phase transition temperature from the C49 structure titanium disilicide to the C54 structure titanium disilicide in the regions having a high impurity concentration.

However, in the conventional method, since the resulting silicide films have almost the same thicknesses on the gate and the diffusion layers, it has now been discovered that this causes the heat resistance of the silicide film on the gate electrode (consisting of polycrystalline silicon) to be lower than that of the silicide film formed on the diffusion layer (which is a single crystal), and the heat resistance of the device itself is thereby limited by the heat resistance of the silicide film on the gate. Although it would be advantageous simply to make the silicide film thick so as to improve the heat resistance, we have further discovered that this increased junction current leakage for diffusion layers having a shallow pn-junction.

SUMMARY OF THE INVENTION

Therefore, the object of the present invention is to solve the above problems.

In order to accomplish the object, according to a first aspect of the present invention, there is provided a semiconductor device having a gate electrode on a first region of a semiconductor substrate, a diffusion layer in a second region of the semiconductor substrate, a first silicide film on a surface of the gate electrode, and a second silicide film on a surface of the diffusion layer, wherein the first silicide film is thicker than the second silicide film.

According to a second aspect of the present invention, there is provided a method of manufacturing a semiconductor device comprising forming a gate electrode on a first region of a semiconductor substrate, forming a diffusion layer in a second region of the semiconductor substrate, forming a first silicide film and a second silicide film on the gate electrode and the diffusion layer, respectively, wherein the first silicide film is thicker than the second silicide film.

According to the present invention, based on the above constitution, since the thickness of the silicide film on the gate electrode is thicker than that on the diffusion layer, it is possible to improve the heat resistance of the silicide film on the gate electrode and also prevent the deterioration in the pn-junction leakage characteristic of the silicide film on the diffusion layer.

BRIEF DESCRIPTION OF THE DRAWINGS

The above and other objects, features, and advantages of the present invention will become more apparent from the following detailed description when taken in conjunction with the accompanying drawings wherein.

DETAILED DESCRIPTION OF THE PREFERRED EMBODIMENTS

Figure 1A:
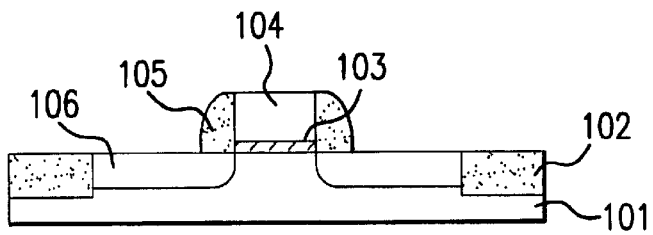
FIGS. 1A to 1E are sectional views schematically showing manufacturing steps of a semiconductor device according to a first embodiment of the present invention.
Figure 1B:
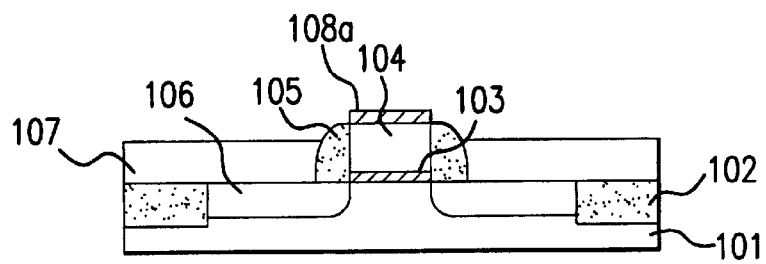
Figure 1C:
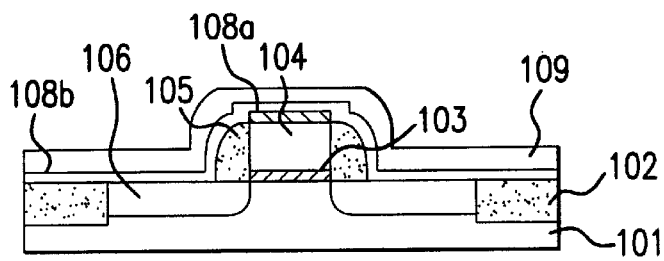
Figure 1D:
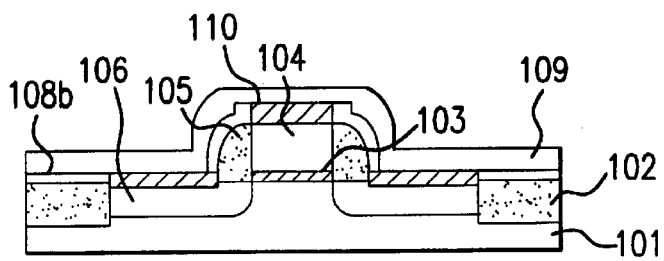
Figure 1E:
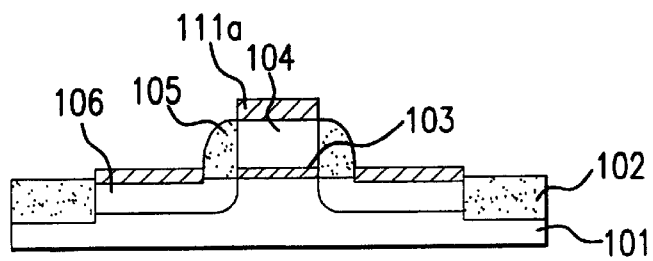

According to one preferred embodiment of the present invention, as shown in FIG. 1E, a semiconductor device has a MOSFET (Metal Oxide Semiconductor Field Effect Transistor) comprising a gate insulating film 103, a polycrystalline silicon gate electrode 104, diffusion layers 106 formed adjacent the gate electrode in a self-aligned manner, side-walls 105 on a silicon substrate 101, isolated by element isolation oxide films 102 and silicide films 111a on the gate electrode 104 and the diffusion layers 106, wherein the silicide film on the gate electrode 104 is thicker than the silicide film on the diffusion layers 106.

Embodiments of the present invention will now be described with reference to the drawings so as to describe the embodiments of the present invention in further detail.

Embodiment 1

As shown in FIG. 1A, conventional materials and methods are employed to form a predetermined region on a silicon substrate 101 by way of element isolation regions 102 with a trench buried structure which have depths of about 300 to 400 nm and widths of about 200 to 500 nm and are composed of silicon oxide films, an MOS transistor comprising a gate oxide film 103 having a thickness of about 5 nm, a polycrystalline silicon gate electrode 104 having a width of 100 to 250 nm and a thickness of about 100 to 150 nm, sidewalls 105 which are provided on side portions of the gate silicon film 104 and composed of a silicon oxide film having a width of about 80 to 100 nm, and diffusion layers 106 provided on both sides of the gate electrode 104.

As shown in FIG. 1B, a mask film 107, which is composed of photoresist and has a thickness of about 500 to 1000 nm, is formed over the gate electrode 104 and the diffusion layers 106. Then the mask film 107 is etched back by an anisotropic etching process, thereby exposing only an upper surface of the gate electrode 104. A first cobalt (Co) film 108a is formed selectively, onto only the exposed gate silicon film 104, so as to have a thickness of about 5 to 10 nm according to an electroless cobalt plating method.

In this electroless cobalt plating method, a plating solution containing cobaltous chloride as a main component is used, and it is preferable to add sodium hypo-phosphite as a reductant to the plating solution and also add sodium tartrate and ammonium chloride, etc. thereto for the purpose of pH adjustment and pH stabilization. The first cobalt film 108a can be formed in accordance with the following routine.

First of all, the silicon substrate 101 is dipped into a solution of palladium (II) chloride having a concentration of 0.01 to 0.05 g/l for 10 to 30 sec. After precipitating a palladium (Pd) film (not shown) of about 1 nm, which is extremely thin, selectively on only the gate silicon film 104 region on the silicon substrate 101 where the silicon is exposed, a wafer is cleaned by aquapura.

Incidentally, the above-discussed process is conducted by precipitating palladium having a high catalytic activity onto the silicon surface in order to make it easy to deposit a plating film uniformly, and it is not always necessary to execute the process for dipping the silicon substrate into the solution of palladium (II) chloride if the cleaned silicon substrate is exposed upon plating.

Next, the silicon substrate 101 is dipped into the above plating solution which is held at a constant temperature of from 50 to 90° C. The first cobalt (Co) film 108a is formed selectively on the exposed gate silicon film 104 so as to have a thickness of 5 to 10 nm. Note that it is effective to reduce a reductant density, adjust pH of the plating solution, decrease the temperature of the plating solution, etc. when it is necessary to suppress a growing speed of the plating film to be at a low level and suppress the influence for the photoresist as a mask film so as to form the first cobalt film 108a which is thin and uniform.

No problem occurs in the electroless cobalt plating step even in case of reducing the selectivity of the growth of the first cobalt film and thus making it non-selective, thereby depositing the plating cobalt film onto the mask film 107, because the undesired plating cobalt film can be removed together with the mask film 107 upon removing the mask film. Further, it is not always necessary to use the electroless plating solution so as to form the first cobalt film 108a, as it is also possible to dip the silicon substrate 101 into a solution containing cobalt ions, thereby precipitating the first cobalt film 108a by ion replacement.

As shown in FIG. 1C, a second cobalt (Co) film 108b is deposited to a thickness of about 10 to 15 nm by a sputtering method, etc., after removing the mask films 107. The second cobalt film 108b can be deposited not only by the sputtering method but also by the CVD method. The titanium nitride (TiN) 109 is formed onto the second cobalt film 108b to a thickness of about 10 to 30 nm so as to prevent oxidation during the silicifying thermal treatment for Co. A tungsten (W) film may be used instead of the TiN film 109.

According to the method of the present embodiment, after forming the first cobalt film 108a onto the gate electrode 104, the second cobalt film 108b is formed onto the first cobalt film 108a and the diffusion layers 106, thereby depositing in this step, the cobalt (Co) film on the gate electrode 104 thicker than that on the diffusion layer 106.

As shown in FIG. 1D, according to the lamp rapid thermal treating method, a thermal treatment is performed in a nitrogen atmosphere at 400 to 700° C. for 10 to 30 sec, the gate electrode 104 and diffusion layers 106 are allowed to react with the first Co film 108a and the second Co film 108b, thereby forming a $Co_xSi_y$ film 110 (where $x \geqq y$) as a reacted layer of Co and Si on the gate electrode 104 and diffusion layers 106. This results in forming the $Co_xSi_y$ film on the gate electrode 104 which is thicker than that on the diffusion layer 106.

As shown in FIG. 1E, after removing the TiN film 109 and the unreacted portions of the first Co film 108a and the second Co film 108b, a second thermal treatment is performed at 750 to 850° C. for 10 to 30 sec, and the reacted phase is converted into a $CoSi_2$ (cobalt disilicide) film 111a, thereby forming the semiconductor device according to the present embodiment.

As explained above, according to the method of the present embodiment, by forming the Co film on the gate electrode 104 which is thicker than that on the diffusion layer 106, this results in making the film thickness of the $CoSi_2$ (cobalt disilicide) film on the gate electrode 104 thicker than that on the diffusion layer 106 as well. Therefore, it is possible to improve the heat resistance of the silicide film on the gate electrode and to prevent deterioration of the pn-junction leakage characteristic because the CoSi2 film on the diffusion layer is not made thick.

Embodiment 2

In this embodiment, nickel is used as a first metallic film and a second metallic film to form the silicide in the present embodiment.

Figure 2A:
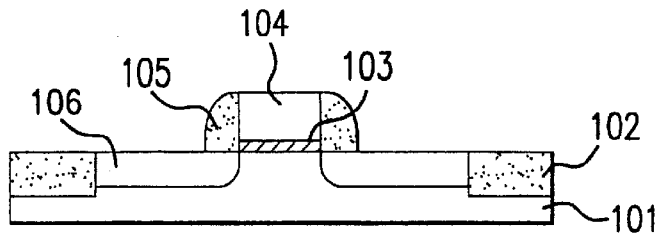
FIGS. 2A to 2E are sectional views schematically showing manufacturing steps of a semiconductor device according to a second embodiment of the present invention.

As shown in FIG. 2A, the same materials and techniques as those of the first embodiment are otherwise employed, thereby forming on a predetermined region on a silicon substrate 101 by way of element isolation regions 102 with a trench buried structure which have depths of about 300 to 400 nm and widths of about 200 to 500 nm and are composed of silicon oxide films, an MOS transistor comprising the gate oxide film 103 having a thickness of about 5 nm, the gate electrode 104 made up of silicon having a width of about 100 to 250 nm and a thickness of about 100 to 150 nm, sidewalls 105 which are provided on side portions of the gate electrode 104 and composed of a silicon oxide film having a width of about 80 to 100 nm, and the diffusion layers 106 provided on both sides of the sidewalls 105.

Figure 2B:
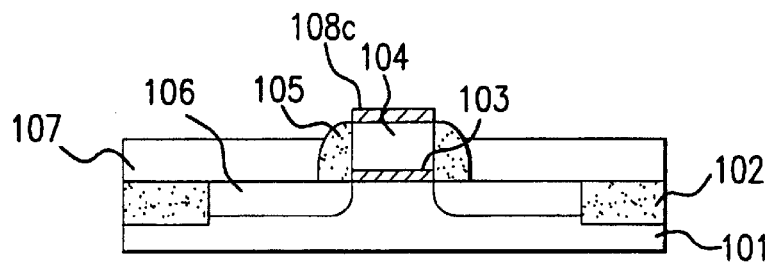

As shown in FIG. 2B, the mask film 107 is composed of photoresist and has a thickness of about 500 to 1000nm. The mask film 107 is formed on the silicon substrate 101, and etched back by an anisotropic etching process, thereby exposing only an upper surface of the gate electrode 104. A first nickel (Ni) film 108c is formed selectively, onto only the exposed upper surface of the gate electrode 104, so as to have a thickness of about 5 to 10 nm according to an electroless nickel plating method.

According to the electroless nickel plating method, a plating solution used for the method contains nickel chloride as a main component, and it is possible to use dimethyl amine borane as a reductant and also add malonic acid and aqueous ammonia, etc. to the plating solution. A plating routine is the same as that of the above-mentioned first embodiment. No problem occurs in the electroless nickel plating step even in case of reducing the selectivity of the growth of the first nickel film 108c, thus making it non-selective, and depositing the nickel film onto the mask films 107, because the undesired nickel film can be removed together with the mask films upon removing the mask films.

Figure 2C:
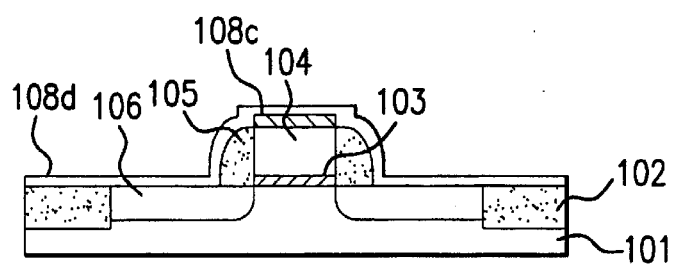

As shown in FIG. 2C, a second nickel (Ni) film 108d is deposited to a thickness of 10 to 15 nm by a sputtering method, etc., after removing the mask film 107. As stated above, according to the present embodiment, the second nickel film 108d is formed on the first nickel film 108c and the diffusion layers 106 after forming the first nickel film 108c on the gate electrode 104 and this, therefore, results in depositing a nickel film on the gate electrode 104 which is thicker than that on the diffusion layers 106.

Figure 2D:
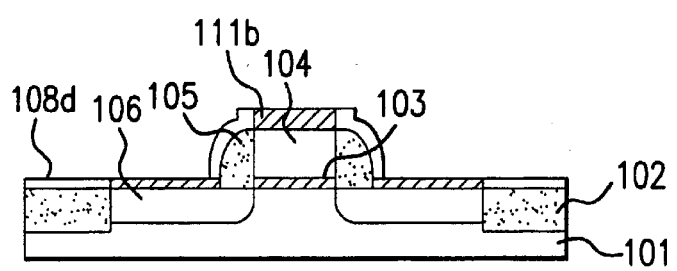
Figure 2E:
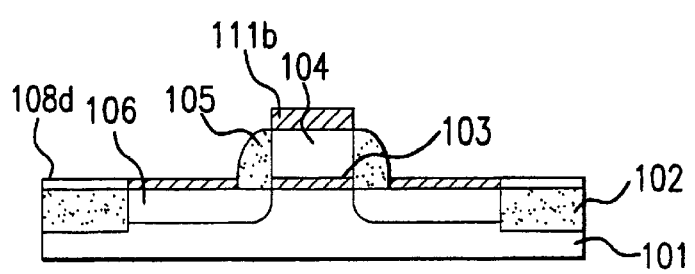
Figure 3A:
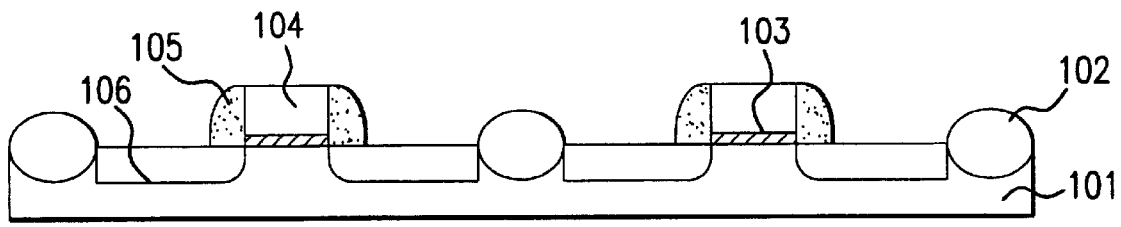
FIGS. 3A to 3D are sectional views schematically showing manufacturing steps of a semiconductor device according to the prior art.
Figure 3B:
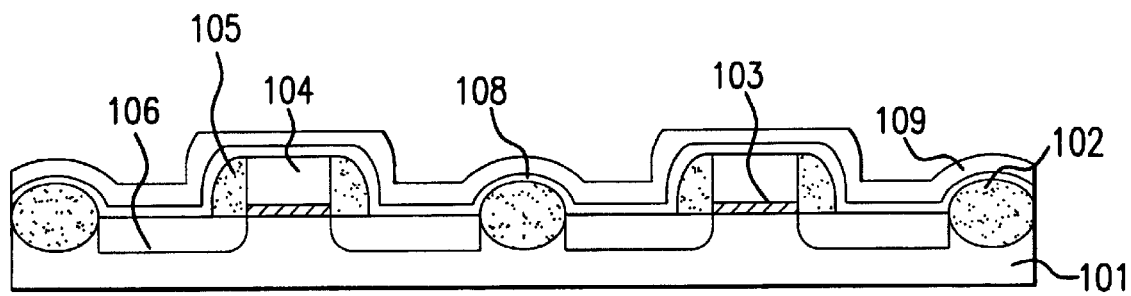
Figure 3C:
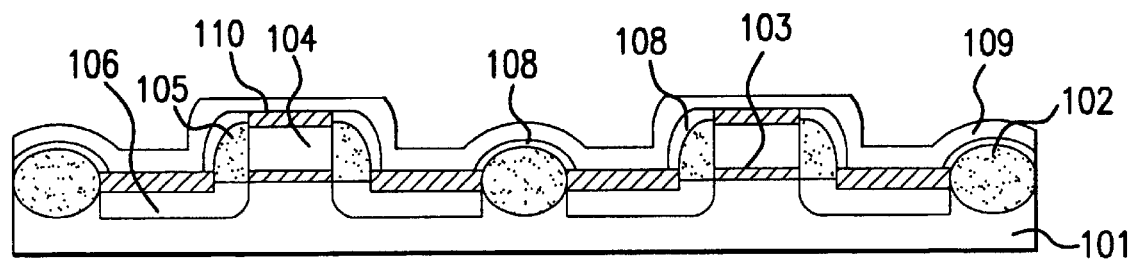
Figure 3D:
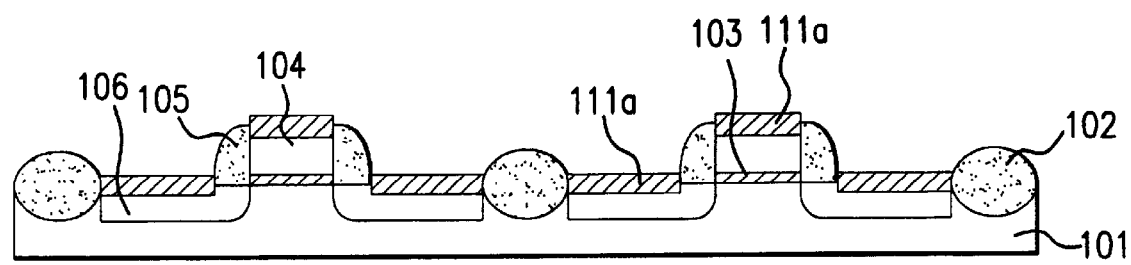

As shown in FIG. 2D, by the lamp rapid thermal annealing method, a thermal treatment is performed in the nitrogen atmosphere at about 300 to 500° C. for about 10 to 30 sec, the gate electrode 104 and diffusion layers 106 are allowed to react with the first Ni film 108c and the second Ni film 108d, thereby phase-transitioning them to a NiSi (nickel monosilicide) film 111b.

Before the thermal treatment, for the purpose of preventing the oxidation of nickel, it is possible to form on the second Ni film 108d, for example, a TiN film or the like which has been mentioned in the first embodiment. In this case, the thermal treatment for silicification is executed in two steps, and it is necessary to remove the TiN film after completing the first thermal treatment.

The reacting process results in a nickel film on the gate electrode 104 which is thicker than that on the diffusion layers 106. This results in making the film thickness of the NiSi (nickel monosilicide) film on the gate electrode 104 thicker than that on the diffusion layer 106. Therefore, it is possible to improve the heat resistance of the silicide film on the gate electrode and to prevent deterioration of the pn-junction leakage characteristic because the NiSi film on the diffusion layer is not made thick.

Although the description has related to embodiments in which cobalt or nickel is used as a material of the silicide film according to the present invention, the present invention is not restricted to those embodiments. It is obvious that other materials may be used to cause the silicide reaction in the equivalent temperature processing while maintaining the characteristics of the gate electrode.

According to the present invention, a metal to be silicified is initially deposited selectively on the gate electrode. After further depositing the metal all over the substrate, the thermal treatment is effected, thereby making it possible to form a thick silicide film on the gate electrode and a thin silicide film on the diffusion layer simultaneously and in a self-aligned manner. Accordingly, it is possible to form a semiconductor device which has both high heat resistance and desirable junction leakage characteristics simultaneously.

The present invention is not limited by the embodiments and it is obvious that they can be modified within the spirit and the scope of the present invention.

What is claimed is:

1. A manufacturing method of a semiconductor device comprising:
    forming a polycrystalline silicon gate electrode on a first region of a silicon substrate;
    forming a diffusion layer in a second region of said silicon substrate;
    forming a mask layer covering said diffusion layer and exposing an upper surface of said gate electrode;
    selectively forming a first metal film on said exposed upper surface of said gate;
    removing said mask layer;
    forming a second metal film on said first metal film and on an unmasked upper surface of said diffusion layer;
    forming a first silicide film and a second silicide film on said gate electrode and said diffusion layer, respectively, by reacting at one time said first and second metal films on said gate electrode and said second metal film on said diffusion layer with said upper surface of said gate electrode and said upper surface of said diffusion layer, respectively.

2. The method as claimed in claim 1, wherein said first and second metal films are cobalt films or nickel films and said first and second silicide films are cobalt silicide films or nickel silicide films.

3. The method as claimed in claim 1, further comprising forming an oxidation preventing film over said second metal film.

4. The manufacturing method of a semiconductor device as claimed in claim 2, wherein said oxidation preventing film is a titanium nitride film or a tungsten film.

5. The method as claimed in claim 1, wherein said mask layer is made by forming a photoresist film over an entire surface of said silicon substrate and etching back said photoresist film to expose said upper surface of said gate electrode.

6. The method as claimed in claim 1, wherein said first metal film is made by an electroless plating method.

7. The method as claimed in claim 1, wherein said first metal film is formed by sputtering or chemical vapor deposition.

8. The method as claimed in claim 1, further comprising selectively forming a palladium film on said exposed upper surface of said gate electrode before forming said first metal film.

9. The method as claimed in claim 1, wherein said first silicide film and said second silicide film are formed by lamp rapid thermal annealing.

10. A manufacturing method of a semiconductor device comprising:

forming a transistor having a gate electrode and a diffusion layer;

forming a first metal film on said gate electrode;

forming a second metal film, which is thinner than said first metal film, on said diffusion layer;

performing an annealing to react said first metal film and said second metal film respectively with said gate electrode and said diffusion layer to form a first silicide film on said gate electrode and a second silicide film that is thinner than said first silicide film on said diffusion layer.

11. The method as claimed in claim 10, wherein said first metal film comprises a first metal layer and a second metal layer formed on said first metal layer, and said second metal film is formed simultaneously with said second metal layer.

12. The method as claimed in claim 11, wherein said first metal layer is made by an electroless plating method.

13. The method as claimed in claim 10, further comprising forming an oxidation preventing film, which covers said first and second metal films before said annealing.

14. The method as claimed in claim 13, wherein said oxidation preventing film is a titanium nitride film or a tungsten film.

15. The method as claimed in claim 10, wherein said-first and second silicide films are cobalt silicide films or nickel silicide films.

* * * * *